(12) United States Patent
Deutsch et al.

(10) Patent No.: US 6,963,204 B2
(45) Date of Patent: Nov. 8, 2005

(54) METHOD TO INCLUDE DELTA-I NOISE ON CHIP USING LOSSY TRANSMISSION LINE REPRESENTATION FOR THE POWER MESH

(75) Inventors: Alina Deutsch, Chappaqua, NY (US); Gerard V. Kopcsay, Yorktown Heights, NY (US); Byron L. Krauter, Round Rock, TX (US); Barry J. Rubin, Croton-on-Hudson, NY (US); Howard H. Smith, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/818,578

(22) Filed: Apr. 6, 2004

(65) Prior Publication Data

US 2005/0218908 A1 Oct. 6, 2005

(51) Int. Cl.⁷ .................. G01R 29/26; G01R 21/00; G06F 17/50
(52) U.S. Cl. .................. 324/613; 702/60; 716/4
(58) Field of Search ................... 324/612–614, 324/600, 620, 537, 763, 158.1, 95, 76.11, 324/719; 702/17, 60, 61, 65, 69, 195, 117, 702/118; 716/1, 4, 7

(56) References Cited

U.S. PATENT DOCUMENTS

| | | | | |
|---|---|---|---|---|
| 5,970,429 A | * | 10/1999 | Martin | 702/65 |
| 6,147,482 A | * | 11/2000 | Kubodera | 324/95 |
| 6,215,373 B1 | * | 4/2001 | Novak et al. | 333/22 R |
| 6,693,439 B1 | * | 2/2004 | Liu et al. | 324/613 |
| 6,696,845 B2 | * | 2/2004 | Kamata | 324/719 |
| 6,757,881 B2 | * | 6/2004 | Andreev et al. | 716/12 |
| 6,807,656 B1 | * | 10/2004 | Cao et al. | 716/4 |
| 2004/0162693 A1 | * | 8/2004 | Corr | 702/117 |

* cited by examiner

Primary Examiner—Anjan Deb
Assistant Examiner—Hoai-An D. Nguyen
(74) Attorney, Agent, or Firm—Scully, Scott, Murphy & Presser; Daniel P. Morris, Esq.

(57) ABSTRACT

The present invention relates to a method for analyzing the noise prediction within one or more electrical circuits, wherein the electrical circuits have a power mesh grid distribution system that feeds power levels to the electrical circuits that are connected by signal wires. After identifying a driver and receiver electrical circuit to be analyzed, a power block is generated that is associated with the driver and receiver electrical circuit by partitioning an area of a power mesh grid distribution system into a power block that can be modeled with lossy transmission line techniques. Next, signal wires situated between the driver and receiver electrical circuits are partitioned into signal blocks that can be modeled with lossy transmission line techniques. Lastly, the power blocks and signal blocks associated with the electrical circuits are analyzed in order to predict the noise performance within the electrical circuits.

29 Claims, 11 Drawing Sheets

FIG. 6A
POWER BLOCK MODEL
IN Y DIRECTION
605

METHOD TO INCLUDE DELTA-I NOISE ON CHIP USING LOSSY TRANSMISSION LINE REPRESENTATION FOR THE POWER MESH

FIELD OF THE INVENTION

This invention relates to electrical circuit analysis and design. More specifically, the invention relates to analysis of noise as a consequence of power distribution for electrical circuits an on-chip circuit designs.

BACKGROUND FOR THE INVENTION

In order to assure their proper functioning, electrical circuits need to be supplied with power supply levels. Various circuits may require several power supply voltages and a ground reference of 0V. The voltage levels utilized by the circuits need to be constant and free of noise in order for the circuits to function properly.

Power distribution systems utilized within a chip may be constructed from a solid plane, mesh plane or a plurality of wires. An ideal plane will embody zero resistance in addition to supplying clean constant voltage levels to electrical circuits. Electrical circuits draw large currents in order to perform electrical operations. These currents are supplied by a system power supply via a power distribution system. When the power distribution system is not ideal, it cannot instantaneously supply the needed current. This is caused by a time constant or delay needed to charge the power distribution impedance Z, where the supplied voltage V is V=ZI, and I is the current drawn by the circuits. The actual geometrical limitation in electrical circuit structures generates a non-ideal power distribution impedance, $Z_{eff}$. The charging of this $Z_{eff}$ will result in a power level "droop" or "delta-I noise" or "simultaneously-switching-noise."

A typical analysis of a power distributor analyzes the entire power distribution as one entire distributed circuit. Such models may be extremely large when millions of circuits exist on a conventional integrated circuit chip or in the instance when many chips are packaged together to form an electronic system. Due to the shear volume of circuitry to analyze, models such as these require long and large numerical computations. For this reason, computations can only replace the actual electrical sources with ideal linear current sources that draw current from the non-ideal power distribution. Therefore, only linear circuit solvers that analyze the noise waveforms can be employed for reasonable computation times.

The implementation of a simplified analysis can only give approximate noise estimations due to the fact that the interaction with other noise sources in actual electrical circuits cannot be accurately captured. Moreover, the effect of noise on the timing of electrical signal propagation can only be approximated.

As the clock frequencies of present electrical circuits is being raised toward 10 GHz and the number of transistor circuits is going from 400 million in the year 2003 to a foreseeable 2200 million in the year 2010, the expected delta-I noise is expected to rise to excessive levels. In order to contain such noise and prevent logic circuit failures, accurate analysis is needed of the power distribution effective impedance $Z_{eff}$, with the use of actual non-linear circuits. This analysis needs to be performed with a fast turnaround time in order to allow for many iterations in a design cycle. Further, new techniques need to be developed that can be implemented in CAD tools that accurately verify or predict the delta-I noise in short time.

As system complexity and speed increase, both accuracy and run times are required to improve in order to have multiple iterations in the design cycle of multi-GHz operation electronic systems. The high level of integration afforded in high-performance systems places large processor units and memory either on the same chip or on the same chip carrier. Communication between processor units and memory involves hundreds of electrical circuits switching simultaneously and sending information. These hundreds of circuits require large current sources that are supplied with very fast transition rates, or $$\frac{dI}{dt}.$$

On chip carriers, the power distribution supplying the power supply levels or rails is in the form of solid conductor planes or mesh planes. These planes have low resistance. A connection to these planes is established through coarse interconnecting conductors called vias. Due to this connection, the effective impedance of the power distribution is mostly inductive, and thus the delta-I noise generated is $V=Z_{eff}I=j2\pi fL_{eff}I$ or $V=NL_{eff}$ $$V = NL_{eff}\frac{dI}{dt},$$

wherein N is the number of driver circuits and f is the frequency of operation. The effective inductance $L_{eff}$ is calculated by modeling the entire chip carrier power planes and vias. A large circuit analysis of this type is very time consuming. On chip power supply levels are fed into the chip from the supporting chip carrier on coarse solder balls or wire bonds. The electric circuits are a few microns in size, while the solder balls are on 200–400 μm pitch.

Power distribution on chip is made out of a plurality of conducting wires that are placed on many thin layers, being interconnected by small vertical conductors also called vias. The spatial distance between the solder balls and the actual circuit contacts will generate an effective $Z_{eff}$ for the power distribution that has both high resistance (R) and inductance (L). Moreover, resistance and inductance are frequency-dependent in this case. Present analysis systems of on-chip power distributions analyze the entire group of power wires and vias for chips that are 20×20 mm in size. Such on-chip power distribution analyses are not frequency-dependent because of the size of the problem. The resistance and inductance at one frequency point are used, thus introducing inaccuracy in the noise prediction.

Current on-chip analyses require many days of modeling time for one configuration of power distribution. Modeling sensitivity analysis or design change benefits cannot be evaluated because of long computation times.

Such analysis can only use approximate linear current sources to represent the actually electrical circuits. The resultant noise is added linearly with other noise sources like crosstalk and reflections that occur on the wires connecting the circuits. Such linear addition is not accurate, therefore, usually the wires are analyzed separately from the power distribution.

The effect of delta-I noise on signal propagation timing is calculated with simplified formulas, for example $V_{noise}/(dI/$ dt). This is very approximate and ignores the non-linear behavior of actual electrical circuits with noisy power rails. Such analyses can do limited assessment of the impact of the chip carrier power distribution on the on-chip power distribution because both models are extremely large.

For the above stated reasons modeling accurate, frequency-dependent, and non-linear simulations are not implemented in CAD tools due to size and time limitations. Many chips are designed without accurate analysis and noise-caused failures prevent product release to customers.

SUMMARY OF THE INVENTION

The present invention relates to a method, computer program product and system for reducing computation complexity and improves the accuracy of noise prediction for a plurality of interconnected lines synchronously propagating signals (i.e., very wide data-buses (hundreds of lines) between a processor and memory units). Further, the invention relates to a methodology based on defining lossy-transmission line power blocks for the power distribution system that can capture the power-supply noise with frequency-dependent properties needed for the many-GHz system operating clock frequencies.

The methodology of the present invention requires only two such power units for each system design that has per-unit-length properties. Further, the methodology allows for the non-linear analysis of the interaction between the noise on the power distribution and the crosstalk, common-mode noise, and reflections on the signal transmission. Additionally, non-linear analysis with non-linear device models and frequency-dependent effects can be included in automated CAD tools for pre-layout optimization studies and automated CAD tools for post-layout noise verification.

An embodiment of the present invention comprises a method for analyzing the noise prediction within one or more electrical circuits, wherein the electrical circuits have a power mesh grid distribution system that feeds power levels to the electrical circuits that are connected by signal wires. The method comprises the step of identifying a driver and receiver electrical circuit to be analyzed and generating a power block associated with the driver and receiver electrical circuit by partitioning an area of a power mesh grid distribution system into a power block that can be modeled with simple lossy transmission line techniques.

The power block is defined with predetermined per-unit-length circuit elements. The length of the power block is determined by the distance between a driver or receiver circuit and a decoupling capacitor that is in closest proximity to the driver or receiver circuit. The width of the power block is determined by the spread of a device that is driving a data bus. Partitioning signal wires situated between the driver and receiver electrical circuits into signal blocks can be modeled with simple lossy transmission line techniques, wherein the signal blocks are defined with a predetermined per-unit-length circuit element. Lastly, the method calls for analyzing the power blocks and signal blocks associated with the electrical circuits to predict the noise performance within the electrical circuits.

A further embodiment of the present invention comprises a computer program product that includes a computer readable medium useable by a processor, the medium having stored thereon a sequence of instructions which, when executed by the processor, causes the processor to analyze the noise prediction within one or more electrical circuits, the electrical circuits having a power mesh grid distribution system that feeds power levels to the electrical circuits that are connected by signal wires.

The computer program product performs the step of identifying a driver and receiver electrical circuit to be analyzed and generating a power block associated with the driver and receiver electrical circuit by partitioning an area of a power mesh grid distribution system into a power block that can be modeled with simple lossy transmission line techniques. The power block is defined with predetermined per-unit-length circuit elements. The length of the power block is determined by the distance between a driver or receiver circuit and a decoupling capacitor that is in closest proximity to the driver or receiver circuit. The width of the power block is determined by the spread of a device that is driving a data bus.

Next, the computer program product performs the step of partitioning signal wires situated between the driver and receiver electrical circuits into signal blocks can be modeled with simple lossy transmission line techniques, wherein the signal blocks are defined with a predetermined per-unit-length circuit element. Lastly, the computer program product analyzes the power blocks and signal blocks associated with the electrical circuits to predict the noise performance within the electrical circuits.

A yet further embodiment of the present invention comprises a computer system for the analysis of the noise prediction within one or more electrical circuits, wherein the electrical circuits having a power mesh grid distribution system that feeds power levels to the electrical circuits that are connected by signal wires. The system comprises an identifying means for the identification of a driver and receiver electrical circuit to be analyzed in addition to a power block generation means for generating a power block associated with the driver and receiver electrical circuit by partitioning an area of a power mesh grid distribution system into a power block that can be modeled with lossy transmission line techniques. Further, a signal wire partitioning means is implemented for simulating the partitioning of signal wires situated between the driver and receiver electrical circuits into signal blocks that can be modeled with lossy transmission line techniques. A circuit analysis means analyzes the identified power blocks and signal blocks associated with the electrical circuits to predict the noise performance within the electrical circuits and the results are displayed on a display means.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION

One or more exemplary embodiments of the invention are described below in detail. The disclosed embodiments are intended to be illustrative only since numerous modifications and variations therein will be apparent to those of ordinary skill in the art. In reference to the drawings, like numbers will indicate like parts continuously throughout the views.

Figure 1:
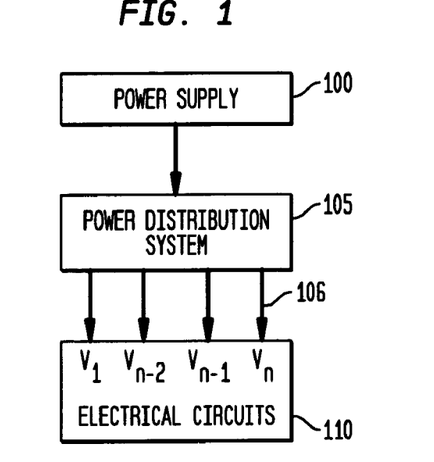
FIG. 1 is a block diagram illustrating a power distribution system for an electrical circuit.

The present invention is initially described in reference to FIG. 1. Electrical circuits 110 generate logic and functions by propagating electric signals between them on interconnecting wires called transmission lines. The circuits are called drivers at the sending end of the transmission lines and the receivers at the end of the transmission lines. In order to function, these circuits 110 have to receive power. This power is fed to the circuits from power supplies 100 through a power distribution system 105. This power distribution system 105 generates constant-level power levels $V_1$, $V_2$, $V_3$ . . . . $V_n$ at the circuit contacts 106 as shown in FIG. 1.

Figure 2A:
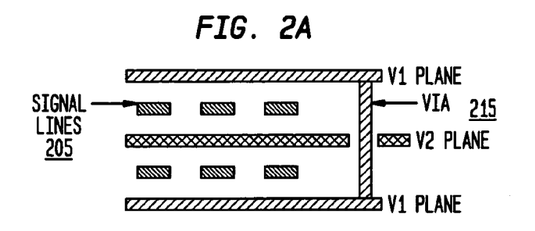
FIGS. 2(a)–(c) illustrates cross sections of power distribution system with solid power planes, mesh power planes and a mesh of power wires, respectively.
Figure 2B:
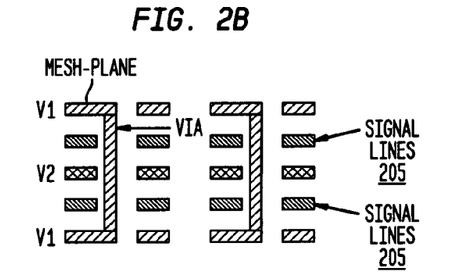
Figure 2C:
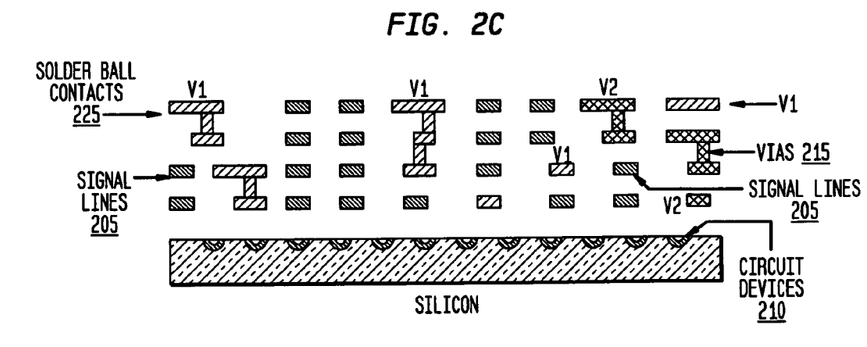

As shown in FIGS. 2(a)–(c), the power distribution system 105 is comprised of solid conducting planes (FIG. 2(a)), mesh conducting planes (FIG. 2(b)) or conducting wires on many layers (FIG. 2(c)). All of these conducting elements are interconnected by vertical conducting elements called vias 215; furthermore, the mesh planes have wide opening holes in them. The conducting planes (FIG. 2(a)–(c)) and vias 215 have a finite resistance.

On-chip, the conducting lines on many layers that form a power distribution mesh, have very high resistance. In general, the vias 215 have variable separations. It must be noted that chip-carrier vias 215 have much larger separations than the vias 215 on chip. These large chip-carrier vias 215 connect to the chip through solder balls 225 or wire bonds. These contacts can be on or about 200–400 µm pitch. Smaller conducting wires on various layers distribute the power supply levels to the circuit devices 210 (drives and receivers) that are embedded in a silicon substrate.

Typical circuit devices might be 1×1 µm in size. Each device needs power. The voltage conductors $V_1$, $V_2$ . . . $V_n$ might be on or about 10 µm pitch. The difference in the spatial distance between the solder balls 225 and the actual device power contacts and the number of signal-to-power conductors on various layers, generates a power distribution with special characteristics. The effective impedance $Z_{eff}$ of such a cross section as seen in FIG. 2(c) will generate an effective voltage "drop" when the power supply current is propagated through it. This "drop" will manifest itself as common-mode noise (CMN) on the signal lines 205. Moreover, the finite $Z_{eff}$ has a value that is frequency-dependent. The effective impedance $Z_{eff}$ also prevents the power level provided by the power supply 100 from instantaneously reaching the devices 210. The result is the subsequent generation of a power supply drop that is referred to as "delta-I noise."

Figure 3:
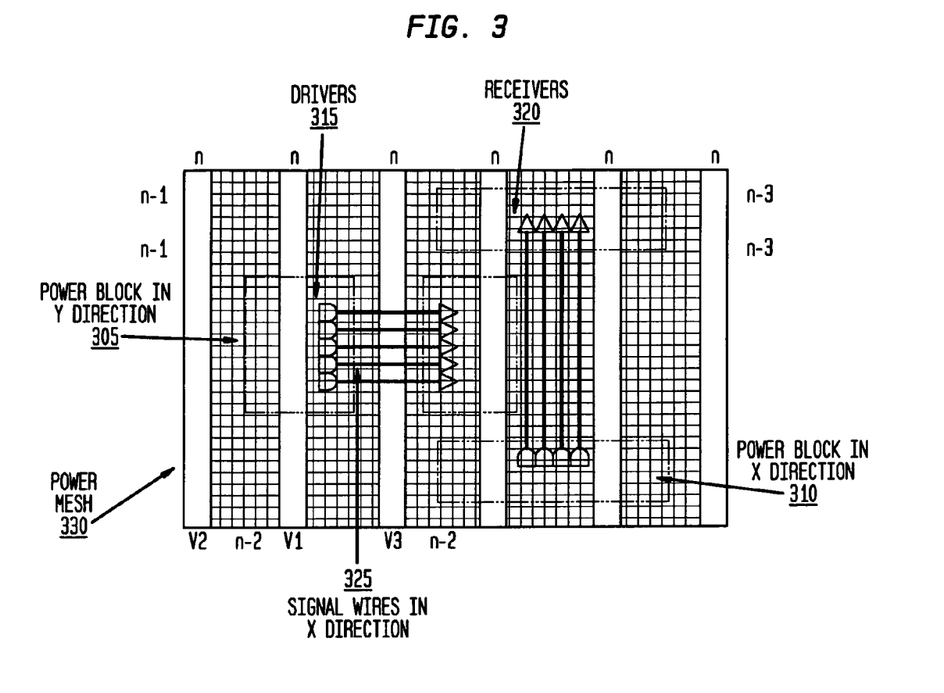
FIG. 3 is a diagram illustrating an embodiment of the present invention used for simulation, analysis, and CAD tools.

As the frequency of operation is increased the signal propagation on the signal lines 205 generates increased coupling and therefore a coupling noise called crosstalk noise. Further, as the frequency of operation is increased, CMN noise is also increasing. In order to contain the level of such noise sources increased numbers of power conductors $V_1$, $V_2$ . . . $V_n$ are included on a chip, wherein the power conductors form a regular mesh 330, as shown in FIG. 3. These regularly interconnected power conductors are on layers n, n-1, n-2, n-3 with alternating X and Y-axis direction.

The actual devices 315, 320 in FIG. 3 (not drawn to scale) are interconnected with signal wires 325 on any of the layers. These interconnecting wires 325 can be in parallel groups of several hundreds between a processor unit and memory. These groupings of wires 325 are called data-buses, wherein a data bus can be oriented in the X or Y-axis direction.

The regular power-mesh 330 does not have to be analyzed as one mass circuit for chips, such chips having the propensity to be as large as 20×20 mm. A chip, in particular in the area around the data-buses, and for GHz operation, requires that the power-mesh 330 needs to be consistent in order to control the characteristics of the signal wires 325 and contain any noise. In such cases, a sample of the regularity of the power-mesh 330 can be captured and analyzed in a computer model by defining the power-mesh 330 as being made out of similar "power" blocks 305,310 with per-unit-length properties. Such building blocks require a substantially smaller model than an analysis utilizing the entire-chip power mesh 330.

Figure 1A:
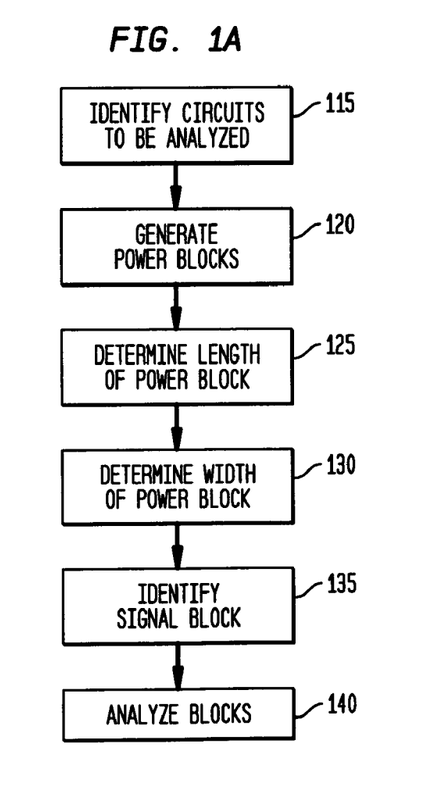
FIG. 1A is a block diagram illustrating a method relating to embodiments of the present invention.

A method for analyzing the areas associated with the afore mentioned building blocks is illustrated in FIG. 1A. The power building blocks need to include a sample of the representative power levels $V_1$, $V_2$ . . . $V_n$, therefore at step 115 an area within the circuit containing a driver and receiver electrical circuit is identified. Next, at step 120, two types of blocks are generated as shown in FIG. 3, one in the X-axis and one in the Y-axis direction. The building blocks have the power rails $V_1$, $V_2$ . . . $V_n$ included as lossy transmission lines and they are referenced to an ideal ground plane. The power blocks are oriented orthogonal to the direction of the signal wires in the data-bus in order to capture the worst case current return path or worst case power $Z_{eff}$. Each power building block has power wires on layers n, n-1, n-2 . . . 1. Only two such blocks are needed to analyze each chip design, therefore, for each new technology generation, this process is repeated once.

Figure 6A:
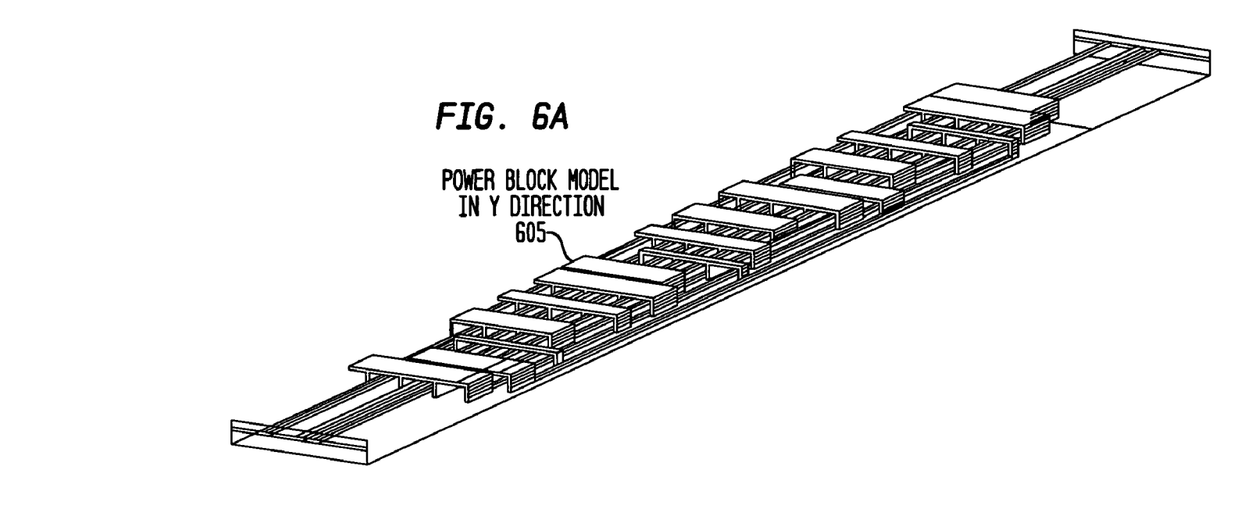
FIGS. 6(a) and (b) show a model of a power block as displayed on a CAD tool.
Figure 6B:
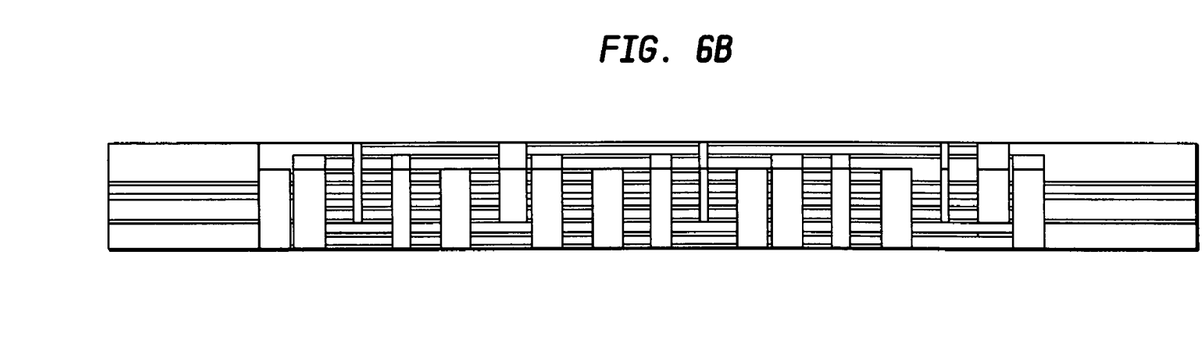

At step 125, the distance between the driver or receiver circuits to the closest decoupling capacitors determines the length of the power block. This length can easily be varied for many sensitivity analyses. At step 130, the width of the block is determined by the spread of the various devices driving the data-bus. FIGS. 6(a) and 6(b) show perspective views of a generated model of a CAD tool display of power blocks 605, wherein the power blocks are simulated in a y-axis direction upon the chip.

At step 135, the signal lines situated between the identified devices are defined as a signal block. Lastly, at step 140, each power-mesh and signal block is analyzed either together or separately in a simulation as a conventional lossy transmission line with frequency-dependent behavior for the signal wires. The representative power and signal blocks can easily be input into post-layout noise verification CAD tools or in pre-layout optimization CAD tools, or analyzed with a conventional linear or non-linear circuit simulator, such as SPICE. Further embodiments of the present invention comprise a computer program product that includes a computer readable medium useable by a processor, the medium having stored thereon a sequence of instructions which, when executed by the processor, causes the processor to analyze the noise prediction within one or more electrical circuits.

Figure 4A:
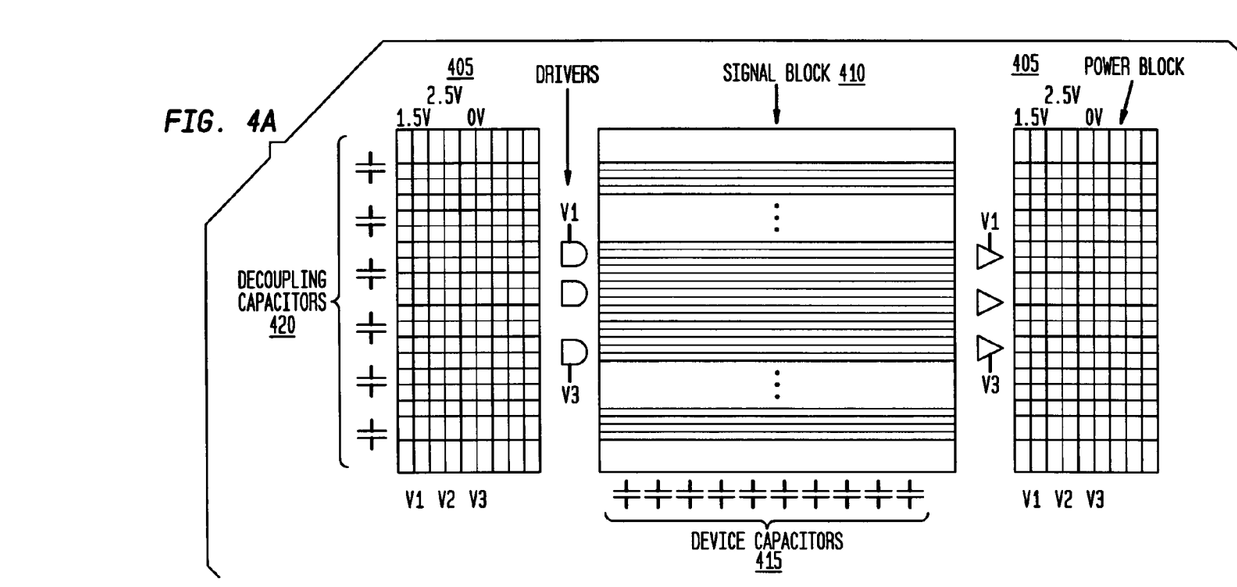
FIG. 4(a) is a diagram illustrating a power block in the Y-axis direction and signal block transmission lines in the X-axis direction and the connection of the power block to the actual device circuits.
Figure 5A:
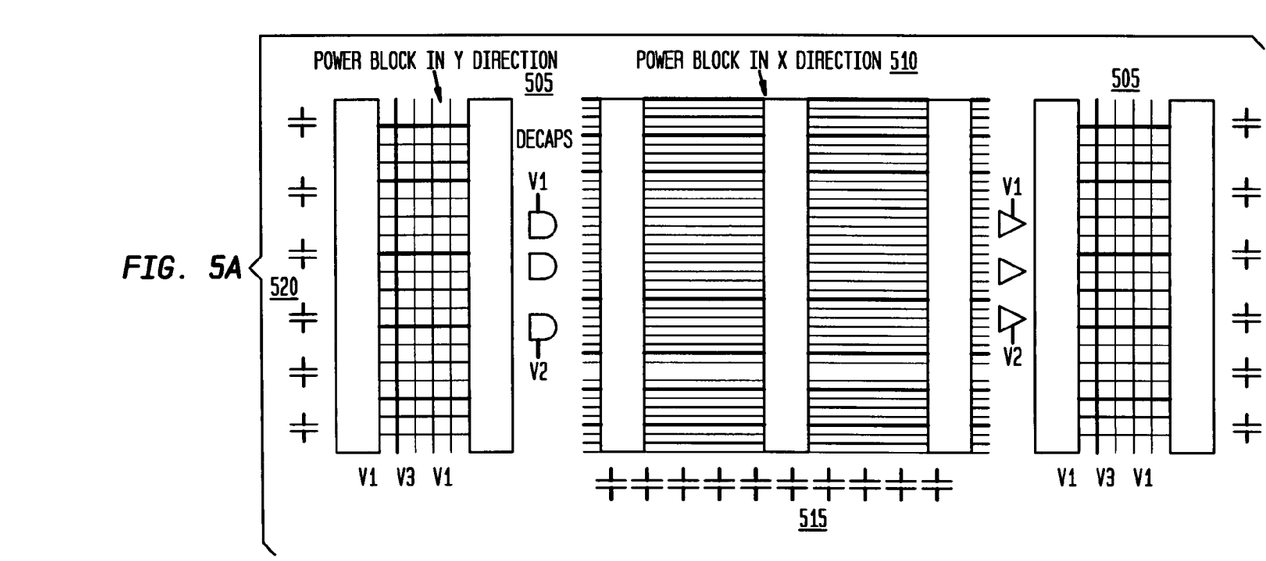
FIG. 5(a) is a diagram of power block in the X-axis direction and signal block transmission lines in the Y-axis direction and the connection of the power block to the actual device circuits.

FIGS. 4(a) and 5(a) give more insight into the orientation of the two types of power blocks and the signal lines in the data-bus. Unlike the simple effective $R_{ef}$ and $L_{eff}$ used in current analyses, these power blocks as shown in FIGS. 4(a) and 5(a) feed the circuit devices. As mentioned above, these power blocks 405, 505 can easily be input into post-layout noise verification CAD tools or in pre-layout optimization CAD tools, or analyzed with a conventional linear or non-linear circuit simulator, such as SPICE.

Figure 4B:
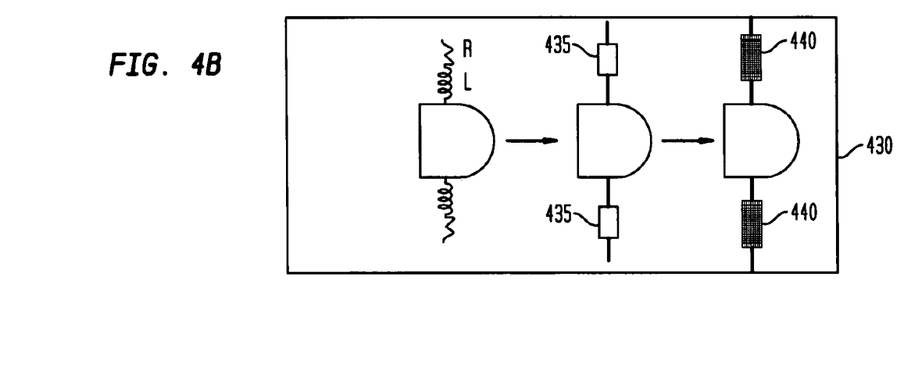
FIG. 4(b) is a diagram illustrating simple RL circuit that may be analyzed within embodiments of the present invention.
Figure 5B:
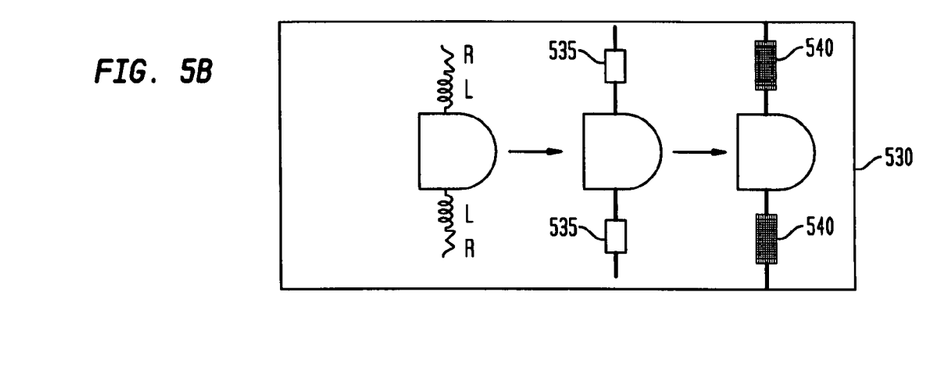
FIG. 5(b) is a diagram illustrating simple RL circuit that may be analyzed within embodiments of the present invention.

As shown in FIGS. 4(a) and 5(a), power blocks 405, 505 are situated on the right and left sides the signal line blocks 410, 510. The two power blocks 405, 505 are required to be situated in a path where the signal lines 410, 510 have a driver and receiver at the respective inputs and outputs of the lines 410, 510. A simple RL circuit 430, 530 is illustrated in FIGS. 4(b) and 5(b). This circuit is generally used in present practice and is situated between a device and a power feed point and is replaced with a block 435, 535 that represents the lossy transmission line of the power-mesh 330. This block may include several power rails such as $V_1$, $V_2$ and $V_3$ (shown at 440 and 540). Any node (i.e., $V_1$ or $V_3$) that is shown in the circuit 430, 530 is attached through this lossy mesh to the actual 1.5V or 0V in this instance.

Placing decoupling capacitors 420, 520 on chip close to the switching devices can compensate for the voltage "droop" generated by $Z_{eff}$. These capacitors 420, 520 store charge that can be supplied to the power lines when current surges occur. The capacitors 420, 520, however, are very costly because they take up chip real estate. The capacitors 420, 520 can easily be connected in the power blocks between $V_1$, $V_2$ . . . $V_n$ in a distributed fashion and easy assessment of their effectiveness or need can be made in simulations. Moreover, the circuits that are not switching and are in the silicon underneath the long data-bus lines, will have additional intrinsic device capacitance 415, 515 that can also supply charge to the power lines. These distributed capacitors 410, 510 can be included in the computer simulations along the signal wires between the power rails as shown in FIGS. 4(a) and 5(a).

Figure 7A:
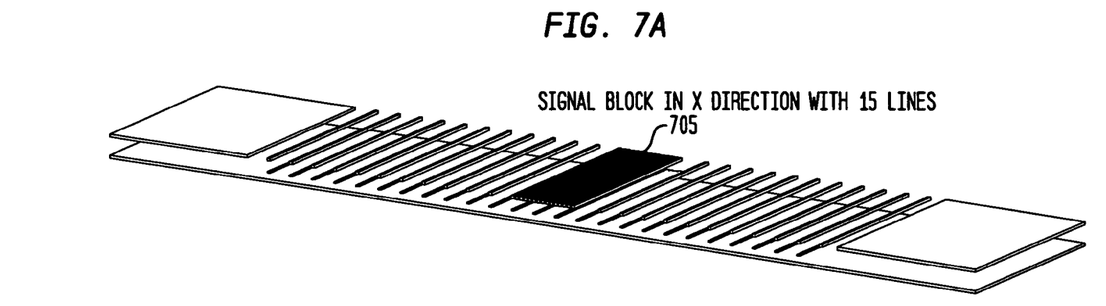
FIGS. 7(a) and (b) shows a model of a signal block with 12 signal lines and 3 lines for $V_1$, $V_2$ and $V_3$.
Figure 7B:
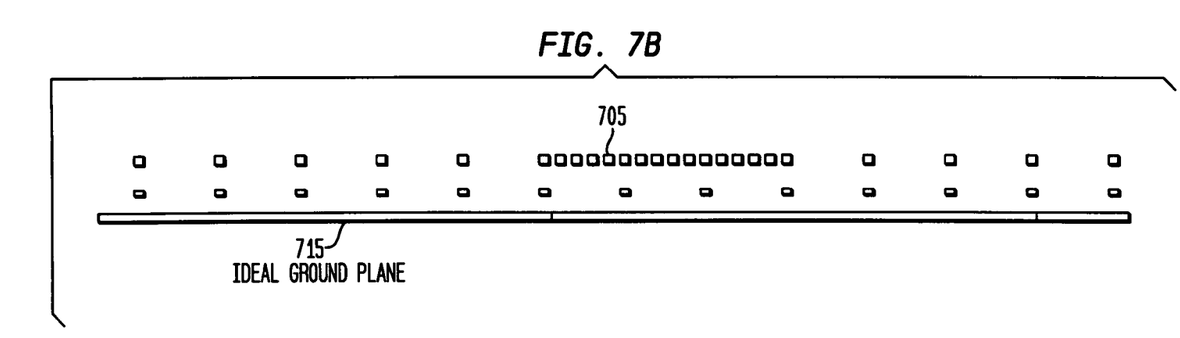

FIGS. 7(a) and (b) show perspective and sectional views of a model of a block 705 situated in the x-axis direction that represents the transmission lines of the signal wires for 12 lines. The power rails used here are the same as the ones used in 405, 505 and 605. These additional conductors are also defined as signal lines such that the 12 signal wires plus the 3 power wires (in this example are $V_1$, $V_2$, $V_3$) form a transmission line block 705 with 15 lines referenced to an ideal power plane 715. The power blocks in 405, 505 and 605 have 3 signal lines for the 3 power levels $V_1$, $V_2$ and $V_3$.

Figure 8:
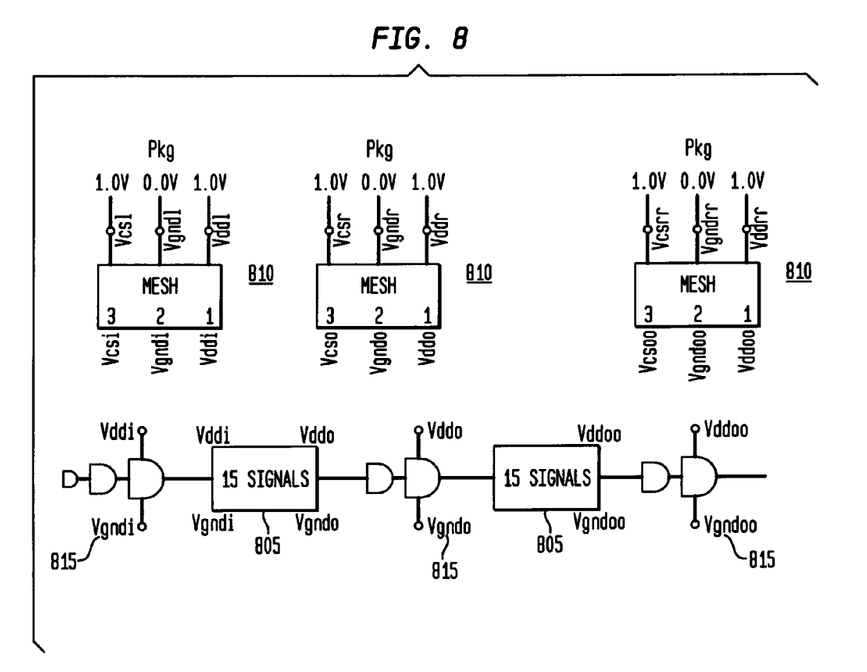
FIG. 8 is a diagram illustrating a circuit diagram that may be used in simulations relating to embodiments of the present invention.

Frequency-dependent impedance characteristics are obtained for both the signal-block and the power-block and inserted into non-linear computer simulations with the non-linear device models of the driver and receiver circuits. A typical simulation circuit is shown in FIG. 8; it shows two sets of 12 line data-buses with the driver and receiver signal blocks 805 and with 3 power blocks 810 for all the circuit device groups 815.

Figure 9:
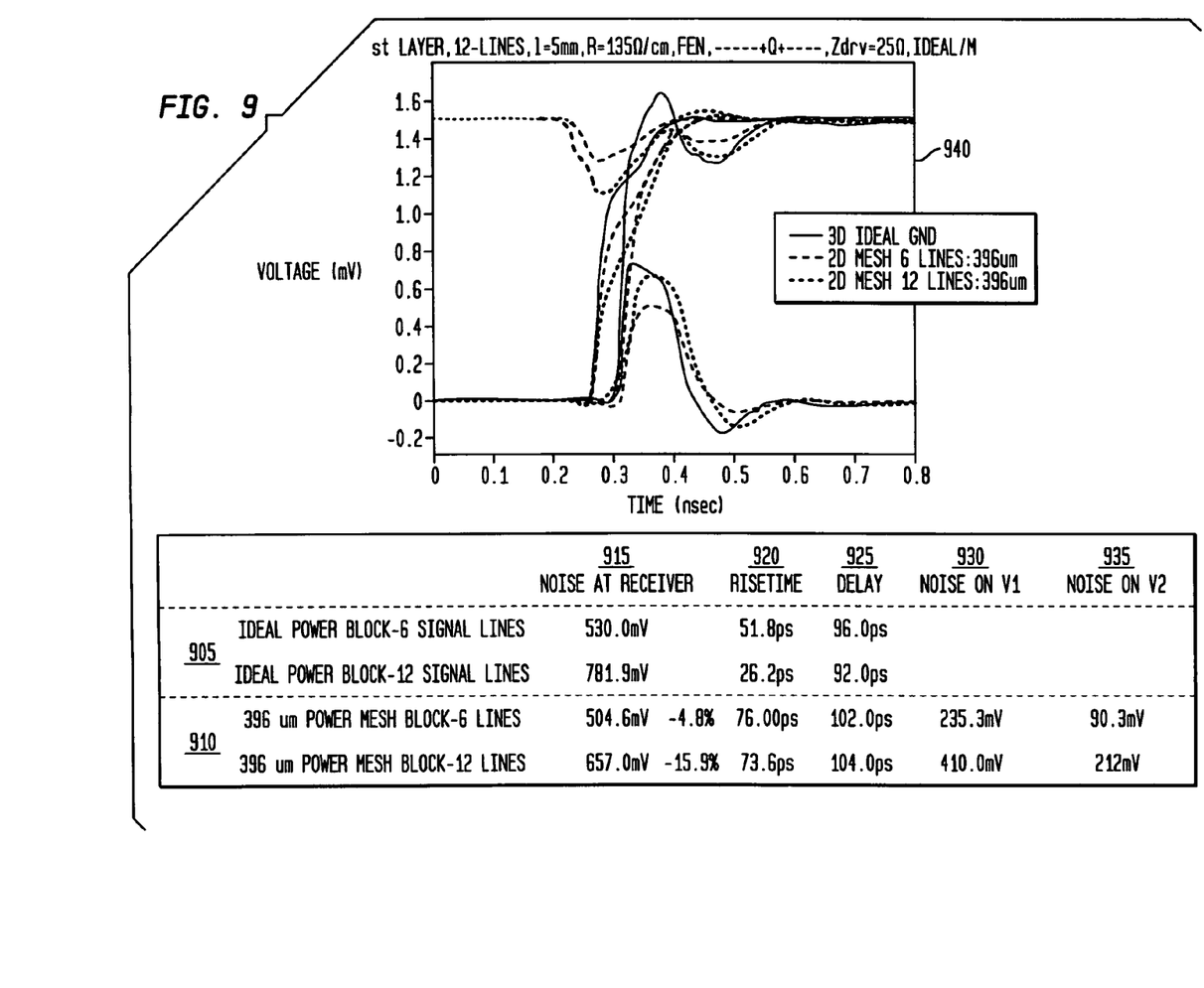
FIG. 9 illustrates simulation results for the instance when the power block is ideal, without frequency dependent losses, and with the power block having frequency-dependent parameters for 6 and 12 signal lines in the signal block.
Figure 10:
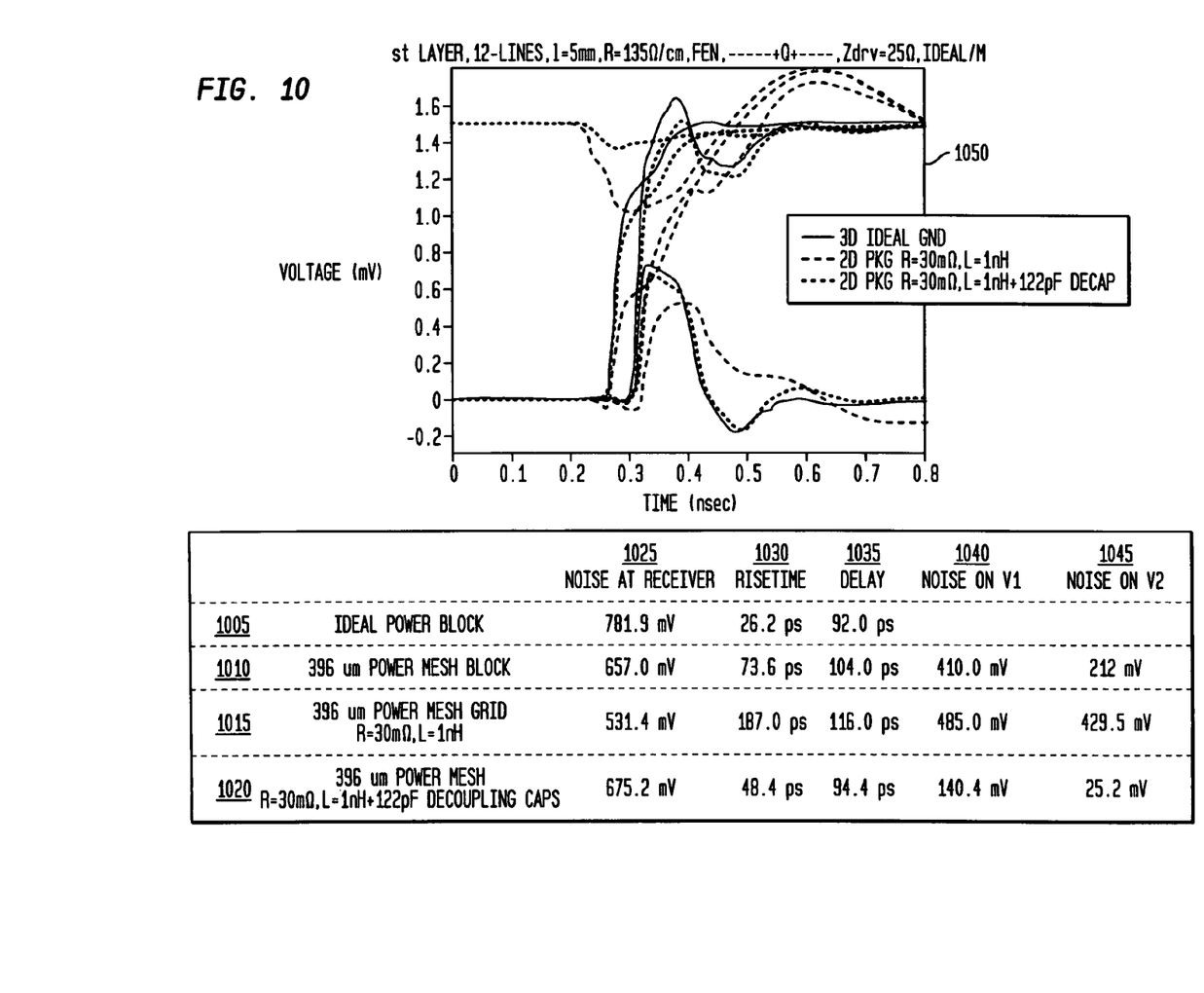
FIG. 10 illustrates simulation results with the ideal power block, with frequency-dependent power block, with the chip-carrier power block included, and with decoupling capacitors attached to the on-chip power block.

FIGS. 9 and 10 show the displayed simulation results 940 for the signals at the end of 5 mm long lines for an ideal power block without frequency dependent losses 905. Further, The delta-I noise on the 1.5V power rail is shown for the actual power block having frequency dependent parameters for six and twelve signal line 910 switching, and a length of power block that is 396 μm; the power block comprising $V_1$, $V_2$ and $V_3$ power rails. Additionally, the simulation displays the determined line noise at the receiver input 915, 1025, the rise-time of the respective waveforms 920, 1030 the delay of the waveforms 925, 1035 and the noise on the voltage lines $V_1$ 930, 1040 and $V_2$ 935, 1045.

The waveforms at the receiver have a much slower rise-time when the delta-I noise effect is taken into account. This slow down of the signal transition reduces the noise on the signal lines, however this reduction is not linear with the number of drivers and this can only be captured with non-linear simulations. Current simple simulations with ideal current sources, as practiced today, would give inaccurate results.

FIG. 10 shows a comparison of the ideal power distribution 1005 and frequency dependent power distribution 1010 with the case when the chip power blocks are also connected to a chip-carrier power distribution that has a $Z_{eff}$ with R=30 mohm and L=1 nH 1015. Further, a third comparison of the chip-carrier distribution model is made that includes 122 pF decoupling capacitors distributed along the power blocks 1020.

Decoupling capacitors 420, 520 on chip isolate the circuits from the damaging effect of the package power distribution $Z_{eff}$. The decoupling capacitors 420, 520 help restore the rise-time of the propagated signal and reduce the delay caused by delta-I noise and reduce the delta-I noise on the 1.5V power rail. The position and size of decoupling can easily and accurately be determined. In addition, it is shown that the slow down of the driver rise-time due to delta-I noise actually reduces the noise on the signal lines. When timing is restored, the signal line total noise is also increased, and thus other methods are needed to reduce CMN and crosstalk noise. These are all non-linear effects captured accurately by the present invention.

Figure 11:
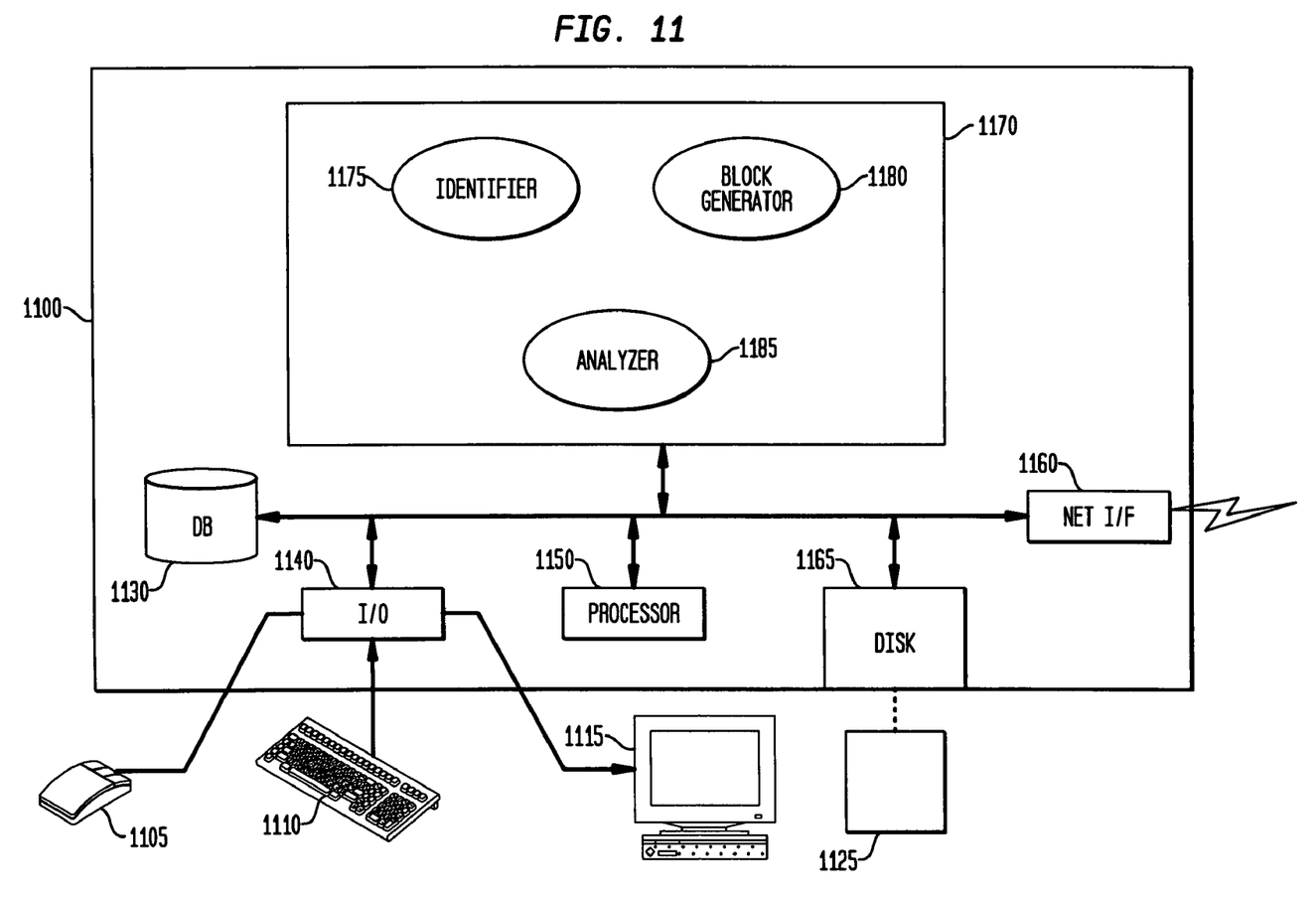
FIG. 11 is a diagram illustrating an embodiment of a computer system that relates to the present invention.

FIG. 11 illustrates a further embodiment of the present invention that comprises a computer system for analyzing the noise prediction within one or more electrical circuits. For purposes of clarity, the computer system 1100 is illustrated as a single or stand-alone server computer, but as persons skilled in the art will recognize, the system can include multiple layers of servers (e.g., front-end and back-end) and storage devices; the client computer operated can be a conventional personal computer.

Completed circuit simulations are displayed on the video monitor 1115. The computer also include other hardware and software elements conventionally included in personal computers, such as a keyboard 1110, a processor 1150, disk storage device 1165 such as a hard disk drive, input/output interfaces 1140, a network interface 1160, a removable read/write storage device 1125 such as a drive that uses a CD-ROM or floppy disk 1125, and a mouse 1105.

The software elements of the programmed computer are illustrated for purposes of clarity as executable in a main memory 1170, but as persons skilled in the art will understand they may not in actuality reside simultaneously or in their entireties in memory 1170. The computer has other hardware and software elements of the types conventionally included in personal computers, such as an operating system, but are not shown for purposes of clarity. Note that software elements can be loaded into the computer via read/write storage device 1125 or network interface 1160.

The software elements of the programmed computer include an identifier means 1175, a power block and signal block generation means 1180 and a power and signal block analysis means 1185. The identifying means 1175 is used to identify a particular driver and receiver electrical circuit that is to be analyzed. After the identification of driver and receiver circuits, the power and signal block generation means 1180 generates a power block that is associated with the driver and receiver electrical circuit by partitioning an area of the power mesh grid distribution system into a power block that can be modeled with lossy transmission line techniques. Further, the power and signal block generation means 1180 partitions the signal wires situated between the identified driver and receiver electrical circuits into signal blocks that can be modeled with lossy transmission line techniques. Lastly, the circuit analysis means 1185 analyzes the power and signal blocks associated with the electrical circuits and the results are displayed to a system operator at the display device 1115.

It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed:

1. A method for analyzing the noise prediction within one or more electrical circuits, the electrical circuits having a power mesh grid distribution system that feeds power levels to the electrical circuits that are connected by signal wires, comprising:
   identifying a driver and receiver electrical circuit to be analyzed;
   generating a power block associated with the driver and receiver electrical circuit by partitioning an area of a power mesh grid distribution system into a power block that can be modeled with lossy transmission line techniques;
   partitioning signal wires situated between the driver and receiver electrical circuits into signal blocks that can be modeled with lossy transmission line techniques; and
   analyzing the power blocks and signal blocks associated with the electrical circuits in order to predict the noise performance within the electrical circuits.

2. The method of claim 1, wherein the power and signal blocks are defined with predetermined per-unit-length circuit elements.

3. The method of claim 2, wherein the length of a power block is determined by the distance between a driver or receiver circuit and a decoupling capacitor that is closest in proximity to the driver or receiver circuit.

4. The method of claim 3, wherein the width of the power block is determined by the spread of a device that is driving a data bus.

5. The method of claim 4, further comprising the step of analyzing the power blocks and signal blocks with a frequency-dependent model.

6. The method of claim 5, wherein the power blocks have the capability to propagate power signals in two directions.

7. The method of claim 6, further comprising the step of analyzing the interaction between noise generated in the power blocks and the noise generated in the signal blocks in one simulation.

8. The method of claim 7, further comprising the step of determining the non-linear effects of the noise interactions between noise generated in the power blocks and noise generated in the signal blocks.

9. The method of claim 8, further comprising the step of determining the effect of the noise generated in the power blocks on the timing of the signals transmitted from the signal lines of the signal blocks.

10. The method of claim 9, further comprising the step of determining the effect of intrinsic capacitors on the noise in the power blocks.

11. The method of claim 10, further comprising the step of determining the effect of multiple voltage levels on the power block.

12. The method of claim 11, further comprising the step of determining the effect of power blocks situated outside of a chip on power bocks situated on a chip.

13. The method of claim 12, further comprising the steps of: assessing the need for and determining the size and position of decoupling capacitors in order to compensate for noise in the power blocks.

14. The method of claim 13, further including the step of utilizing the power and signal blocks in pre-layout automated CAD tool for optimization studies.

15. The method of claim 14, further including the step of utilizing the power and signal blocks in a post-layout CAD tool for noise verification.

16. A computer program product that includes a computer readable medium useable by a processor, the medium having stored thereon a sequence of instructions which, when executed by the processor, causes the processor to analyze the noise prediction within one or more electrical circuits, the electrical circuits having a power mesh grid distribution system that feeds power levels to the electrical circuits that are connected by signal wires, wherein the computer program product executes the steps of:
   identifying a driver and receiver electrical circuit to be analyzed;
   generating a power block associated with the driver and receiver electrical circuit by partitioning an area of a power mesh grid distribution system into a power block that can be modeled with simple transmission line techniques;
   partitioning signal wires situated between the driver and receiver electrical circuits into signal blocks that can be modeled with simple transmission line techniques; and analyzing the power blocks and signal blocks associated with the electrical circuits in order to predict the noise performance within the electrical circuits.

17. The computer program product of claim 16, wherein the power and signal blocks are defined with predetermined per-unit-length circuit elements.

18. The computer program product of claim 17, wherein the length of a power block is determined by the distance between a driver or receiver circuit and a decoupling capacitor that is closest in proximity to the driver or receiver circuit.

19. The computer program product of claim 18, wherein the width of the power block is determined by the spread of a device that is driving a data bus.

20. The computer program product of claim 19, further comprising the step of analyzing the power blocks and signal blocks with a frequency-dependent model.

21. The computer program product of claim 20, wherein the power blocks are propagated in two directions along a horizontal and vertical axis.

22. The computer program product of claim 21, further comprising the step of analyzing the interaction between noise generated in the power blocks and the noise generated in the signal blocks in one simulation.

23. The computer program product of claim 22, further comprising the step of determining the non-linear effects of the noise interactions between noise generated in the power blocks and noise generated in the signal blocks.

24. The computer program product of claim 23, further comprising the step of determining the effect of the noise generated in the power blocks on the timing of the signals transmitted from the signal lines of the signal blocks.

25. The computer program product of claim 24, further comprising the step of determining the effect of intrinsic capacitors on the noise in the power blocks.

26. The computer program product of claim 25, further comprising the step of determining the effect of multiple voltage levels on the power block.

27. The computer program product of claim 26, further comprising the steps of:
   assessing the need for and determining the size and position of decoupling capacitors in order to compensate for noise in the power blocks.

28. The computer program product of claim 27, further comprising the step of determining the effect of power blocks situated outside of a chip on power bocks situated on a chip.

29. A computer system for analyzing the noise prediction within one or more electrical circuits, the electrical circuits having a power mesh grid distribution system that feeds power levels to the electrical circuits that are connected by signal wires, comprising:
   an identifying means for the identification of a driver and receiver electrical circuit to be analyzed;
   a power and signal block generation means for generating a power block associated with the driver and receiver electrical circuit by partitioning an area of a power mesh grid distribution system into a power block that can be modeled with lossy transmission line techniques, and further partitioning signal wires situated between the driver and receiver electrical circuits into signal blocks that can be modeled with lossy transmission line techniques; and
   a circuit analysis means for analyzing the power blocks and signal blocks associated with the electrical circuits in order to predict the noise performance within the electrical circuits.

* * * * *